United States Patent
van Roosmalen et al.

(10) Patent No.: US 6,639,477 B2
(45) Date of Patent: Oct. 28, 2003

(54) OSCILLATOR, TRANSMITTER PROVIDED WITH SUCH AN OSCILLATOR, AND USE OF SUCH A TRANSMITTER

(75) Inventors: Marcel Wilhelm R. M van Roosmalen, Hengelo (NL); Berend Hendrik Essink, Enschede (NL); Christian Alexander Smit, Hengelo (NL)

(73) Assignee: Telefonaktiebolaget LM Ericsson, Stockholm (SE)

(*) Notice: Subject to any disclaimer, the term of this patent is extended or adjusted under 35 U.S.C. 154(b) by 102 days.

(21) Appl. No.: 09/740,010

(22) Filed: Dec. 20, 2000

(65) Prior Publication Data

US 2001/0015680 A1 Aug. 23, 2001

(30) Foreign Application Priority Data

Dec. 23, 1999 (NL) .............................................. 1013936

(51) Int. Cl.$^7$ .................................................. H03B 1/00
(52) U.S. Cl. ................... 331/76; 331/117 R; 331/167; 331/177 FE; 455/313; 455/317; 455/323; 455/302
(58) Field of Search .............................. 331/117 R, 167, 331/117 FE, 132, 76; 455/313, 317, 323, 302

(56) References Cited

U.S. PATENT DOCUMENTS

| | | | |
|---|---|---|---|
| 4,141,209 A | 2/1979 | Barnett et al. | 368/159 |
| 4,612,667 A | 9/1986 | Hansen | 455/98 |
| 5,920,235 A | * 7/1999 | Beards et al. | 331/108 D |
| 6,327,464 B1 | * 12/2001 | Hayasaka | 455/286 |

FOREIGN PATENT DOCUMENTS

| | | |
|---|---|---|
| EP | 0400425 | 12/1990 |
| EP | 0767532 | 4/1997 |

* cited by examiner

Primary Examiner—Arnold Kinkead
(74) Attorney, Agent, or Firm—Burns Doane Swecker & Mathis LLP

(57) ABSTRACT

An oscillator has a resonator which includes at least one capacitor and at least one inductor. The resonator supplies a first signal of a first frequency at an output of the resonator. A frequency multiplier or a frequency divider is connected, via an input thereof, to the resonator output. The frequency multiplier or frequency divider supplies a second signal of a second frequency at an output of the frequency multiplier or frequency divider. The second frequency is n times or 1/n times (n≧2 and integer) the first frequency. A tuned circuit is part of the resonator and forms a short circuit or an open connection for the second frequency.

30 Claims, 2 Drawing Sheets

US 6,639,477 B2

OSCILLATOR, TRANSMITTER PROVIDED WITH SUCH AN OSCILLATOR, AND USE OF SUCH A TRANSMITTER

FIELD OF THE INVENTION

The invention relates to an oscillator, comprising a resonator which includes at least one capacitor and at least one inductor, said resonator being designed to supply a first signal of a first frequency at an output of the resonator; and a frequency multiplier or frequency divider having an input which is connected directly or indirectly to the resonator output, said frequency multiplier or frequency divider, respectively, being designed to supply a second signal of a second frequency at an output of the frequency multiplier or frequency divider, respectively, the second frequency being n times or 1/n times, respectively, ($n \geq 2$ and integer) the first frequency. The invention further relates to a transmitter which is provided with such an oscillator, and the use of such a transmitter for various applications.

DISCUSSION OF THE PRIOR ART

When oscillators are used, electromagnetic feedback between the oscillator output signal (the second signal) and the resonator circuit may result in the frequency of the oscillator output signal deviating considerably from the set frequency, which is highly undesirable. Such feedback can arise, for example, via the supply voltage, as a result of the component configuration chosen, via an amplifier circuit or, if the oscillator forms part of a transmitter or a transceiver, via the electromagnetic radiation emitted by an antenna.

One measure taken in the prior art to reduce electromagnetic feedback in an oscillator is to employ a frequency doubler downstream of the resonant circuit. Feedback of the frequency-doubled signal to the resonant circuit leads to said signal being filtered out by the resonant circuit. In the ideal case, therefore, no frequency deviation due to electromagnetic feedback will occur. In practice, however, frequency mixing products being generated in the oscillator do give rise to frequency deviations as a result of non-linearities in the oscillator circuits which cause the frequency products of signals to be generated.

SUMMARY OF THE INVENTION

It is an object of the invention to further suppress frequency deviation in an oscillator output signal resulting from electromagnetic feedback when a frequency multiplier or a frequency divider is used.

To this end, the oscillator according to the invention is characterized by a tuned circuit which is part of the resonator and which forms a short circuit or an open connection for the second frequency. Thanks to this measure it is possible, notwithstanding the nonlinearity of oscillator components, to largely suppress oscillator frequency deviation resulting from electromagnetic feedback.

In a preferred embodiment, the resonator comprises a series connection of at least one capacitor and at least one inductor, said series connection being connected in parallel with an inductor. This produces a short circuit for the second frequency.

In another preferred embodiment, the resonator comprises a parallel connection of at least one capacitor and at least one inductor, said series connection being connected in series with a capacitor. This produces a open connection for the second frequency.

The claims and advantanges will be more readily appreciated as the same becomes better understood by reference to the following detailed description and considered in connection with the accompanying drawings in which like reference symbols designate like parts.

BRIEF DESCRIPTIONS OF THE DRAWINGS

DESCRIPTION OF THE PREFERED EMBODIEMENTS

Figure 1:
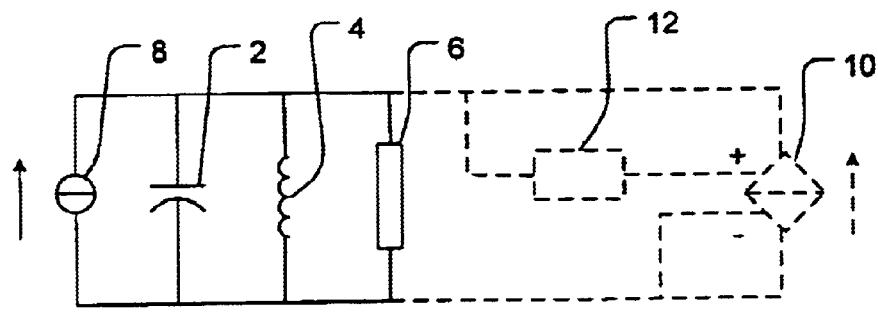
FIG. 1 shows a schematic electrical network model of an oscillator to illustrate the occurrence of electromagnetic feedback.

FIG. 1 shows a resonator which is modelled as a parallel connection of a capacitor 2, an inductor 4, and a resistor 6. The resonator has a resonant frequency which is primarily determined by the capacitance of the capacitor 2 and the inductance of the inductor 4. A current source 8 represents an active element. The combination of the resonator 2, 4, 6 and the active element 8 forms an oscillator. A combination of a (fictitious) voltage-controlled current source 10 and a (fictitious) delay element 12 represents an electromagnetic feedback in the oscillator, a feedback signal being generated in the process. The combination 10, 12 in fact behaves as a variable complex impedance having a resistive, capacitive or inductive character or a combination thereof, depending on the rating of the delay element 12. Consequently, the resonant frequency of the resonator will shift as a function of the phase of the feedback signal.

Figure 2:
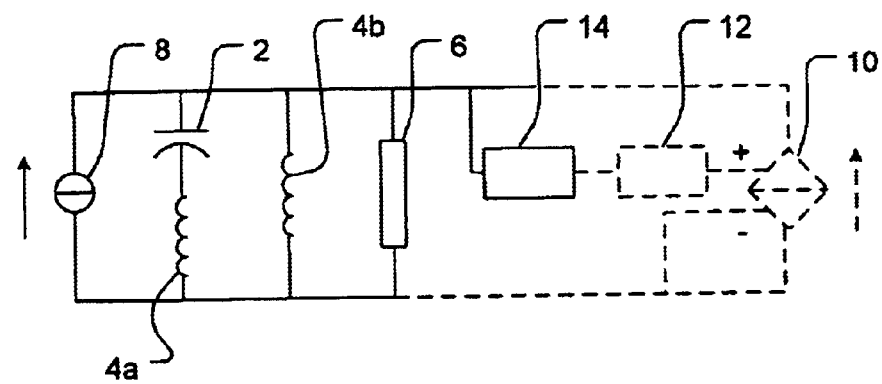
FIG. 2 shows a schematic electrical network model of an oscillator according to the invention, partially in the form of a block diagram.

FIG. 2 shows a modified resonator, comprising a series connection of the capacitor 2 and an inductor 4a, said series connections being connected in parallel with an inductor 4b and the resistor 6. As in FIG. 1, electromagnetic feedback occurs in the oscillator, said feedback being represented by the combination of the voltage-controlled current source 10 and the delay element 12. Additionally, the oscillator comprises a frequency multiplier 14. The frequency multiplier 14 converts a signal of a first frequency into a signal of a second frequency, the second frequency being n times ($n \geq 2$ and integer) the first frequency. An example of such a frequency multiplier 14 is a frequency doubler. The use of a frequency multiplier in theory will result in the feedback signal containing no harmonic of a frequency equal to the fundamental frequency of the resonator 2, 4a, 4b, 6. In practice, however, non-linearities of circuit components, for example the active part 8, do indeed give rise to such a mixing product in the resonator, as a result of which undesirable frequency deviation occurs in the oscillator 2, 4a, 4b, 6, 8. In the circuit according to FIG. 2, this problem is largely overcome, in accordance with the invention, by the incorporation in the resonator of an additional reactive element 4a having such a rating that the series connection of capacitor 2 and inductor 4a forms a short circuit for signals of the frequency supplied by the frequency multiplier 14.

Figure 3:
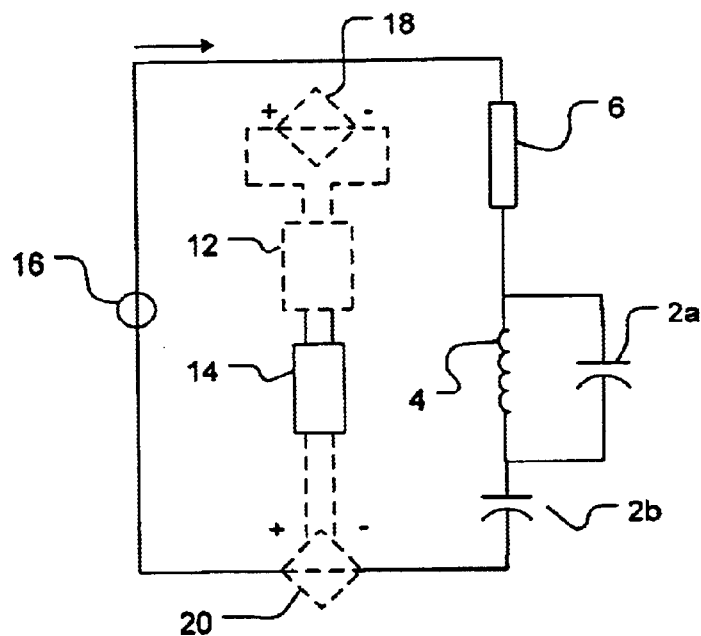
FIG. 3 shows the dual network model of the circuit according to FIG. 2.

FIG. 3 shows the dual network model of the network model according to FIG. 2. Here, a parallel connection of a capacitor 2a and the inductor 4 is connected in series with a capacitor 2b and the resistor 6. A voltage source 16 takes the place of the current source 8. Finally, the network model comprises a current-controlled voltage source 18 and a voltage-controlled voltage source 20. The parallel connection of the capacitor 2a and the inductor 4 forms an open connection for signals of the frequency supplied by the frequency multiplier 14.

Figure 4:
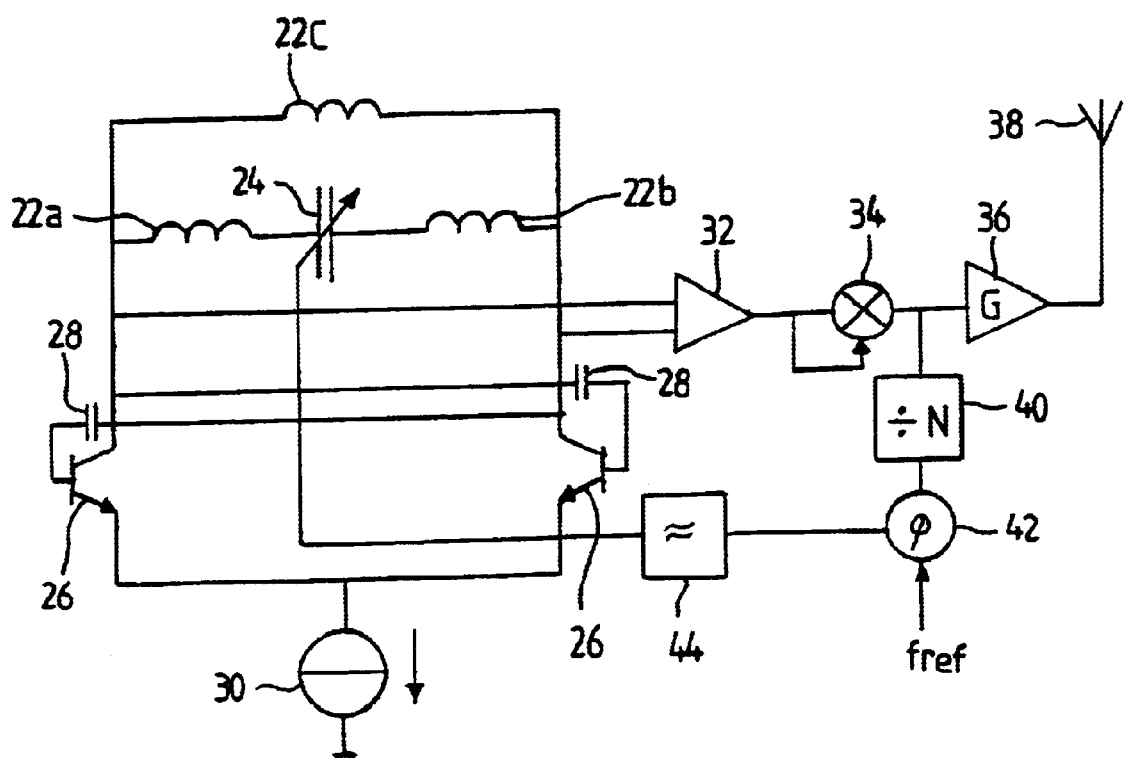
FIG. 4 shows a schematic electrical network model, partially in the form of a block diagram, of a transmitter according to the invention.

FIG. 4 shows a voltage- or current-controlled resonator which comprises a series connection of an inductor 22a, a voltage- or current-controlled capacitor 24, and an inductor 22b, said series connection being connected in parallel with an inductor 22c. An oscillator of which the resonator forms part comprises an active part having amplifying elements 26, capacitors 28 and a current source 30. The oscillator 22a, 22b, 22c, 24, 26, 28, 30 supplies a signal of a first frequency which is fed to a buffer 32. The output signal of the buffer 32 is fed to a frequency multiplier 34 which outputs a signal of a second frequency which is twice as high as the first frequency. The output signal of the frequency multiplier 34 is fed, on the one hand, via an amplifier 36 to an antenna 38, and is used, on the other hand, to derive, via a frequency divider 40, a signal whose phase is compared, in phase comparator element 42, to that of a signal of a reference frequency $f_{ref}$. The result of the comparison is fed to a loop filter 44 which supplies an output signal for adjusting the capacitance of the capacitor 24 and thus for adjusting the resonant frequency of the resonator 22a, 22b, 22c, 24. The undesirable electromagnetic feedback, induced, for example, by the antenna 38 causes virtually no unwanted frequency deviation in the resonator if the series connection of the inductors 22a and 22b and the capacitor 24 forms a short circuit for double the resonant frequency of the resonator.

The circuit according to FIG. 4 can be used in various types of transmitters such as those which form part of a GSM communications system, for example in a GSM telephone set, or those which form part of a DECT communications system, for example in a DECT telephone set, or those which form part of a Bluetooth® communications system, for example a Bluetooth® telephone set, PC, printer, scanner, fax or the like.

Whilst hereinabove a resonator is represented by a specific circuit arrangement of one or more capacitive or inductive elements, alternative circuit arrangements in which resonance can be generated can also be employed. The capacitive and inductive elements can be adjustable, e.g. by a suitable voltage being applied, or have a fixed capacitance or inductance, respectively.

Instead of a frequency multiplier it is alternatively possible to use a frequency divider, which converts a signal of a first frequency into a signal of a second frequency, the second frequency being 1/n times ($n \geq 2$ and integer) the first frequency. The capacitances and inductances of the components of the corresponding resonators are modified mutatis mutandis in that case.

While the invention has been described and illustrated in its preferred embodiments, it should be understood that departures may be made therefrom within the scope of the invention, which is not limited to the details disclosed herein.

What is claimed is:

1. An oscillator, comprising:
    a resonator which includes at least one capacitor and at least one inductor, said resonator being designed to supply a first signal of a first frequency at an output of the resonator; and
    a frequency multiplier having an input which is connected to the resonator output, said frequency multiplier being designed to supply a second signal of a second frequency at an output of the frequency multiplier, the second frequency being n times ($n \geq 2$ and integer) the first frequency,
    the oscillator further comprising a tuned circuit which is part of the resonator and which forms a short circuit or an open connection for the second frequency.

2. The oscillator of claim 1, wherein the resonator comprises a series connection of at least one capacitor and at least one inductor, said series connection being connected in parallel with an inductor.

3. The oscillator of claim 1, wherein the resonator comprises a parallel connection of at least one capacitor and at least one inductor, said parallel connection being connected in series with a capacitor.

4. The oscillator of claim 1, wherein the frequency multiplier is a frequency doubler.

5. The oscillator of claim 1, wherein the first frequency is adjustable with the aid of a voltage or current.

6. An oscillator, comprising:
    a resonator which includes at least one capacitor and at least one inductor, said resonator being designed to supply a first signal of a first frequency to an output of the resonator; and
    a frequency divider having an input which is connected to the resonator output, said frequency divider being designed to supply a second signal of a second frequency at an output of the frequency divider, the second frequency being 1/n times ($n \geq 2$ and integer) the first frequency,
    the oscillator further comprising a tuned circuit which is part of the resonator and which forms a short circuit or an open connection for the second frequency.

7. The oscillator of claim 6, wherein the resonator comprises a series connection of at least one capacitor and at least one inductor, said series connection being connected in parallel with an inductor.

8. The oscillator of claim 6, wherein the resonator comprises a parallel connection of at least one capacitor and at least one inductor, said parallel connection being connected in series with a capacitor.

9. The oscillator of claim 6, wherein the frequency divider is a frequency halver.

10. The oscillator of claim 6, wherein the first frequency is adjustable with the aid of a voltage or current.

11. A transmitter provided with an oscillator, the oscillator comprising:
    a resonator which includes at least one capacitor and at least one inductor, said resonator being designed to supply a first signal of a first frequency at an output of the resonator; and
    a frequency multiplier having an input which is connected to the resonator output, said frequency multiplier being designed to supply a second signal of a second frequency at an output of the frequency multiplier, the second frequency being n times ($n \geq 2$ and integer) the first frequency,
    the oscillator further comprising a tuned circuit which is part of the resonator and which forms a short circuit or an open connection for the second frequency.

12. A transmitter provided with an oscillator, the oscillator comprising:
    a resonator which includes at least one capacitor and at least one inductor, said resonator being designed to supply a first signal of a first frequency to an output of the resonator; and a frequency divider having an input which is connected to the resonator output, said frequency divider being designed to supply a second signal of a second frequency at an output of the frequency divider, the second frequency being 1/n times (n≧2 and integer) the first frequency, the oscillator further comprising a tuned circuit which is part of the resonator and which forms a short circuit or an open connection for the second frequency.

13. In a communications system, a use of a transmitter provided with an oscillator, the oscillator comprising:

a resonator which includes at least one capacitor and at least one inductor, said resonator being designed to supply a first signal of a first frequency at an output of the resonator; and a frequency multiplier having an input which is connected to the resonator output, said frequency multiplier being designed to supply a second signal of a second frequency at an output of the frequency multiplier, the second frequency being n times (n≧2 and integer) the first frequency, the oscillator further comprising a tuned circuit which is part of the resonator and which forms a short circuit or an open connection for the second frequency, the communications system being selected from a group of communications systems comprising a GSM communications system, a DECT communications system and a Bluetooth® communications system.

14. In a communications system, a use of a transmitter provided with an oscillator, the oscillator comprising:

a resonator which includes at least one capacitor and at least one inductor, said resonator being designed to supply a first signal of a first frequency to an output of the resonator; and a frequency divider having an input which is connected to the resonator output, said frequency divider being designed to supply a second signal of a second frequency at an output of the frequency divider, the second frequency being 1/n times (n≧2 and integer) the first frequency, the oscillator further comprising a tuned circuit which is part of the resonator and which forms a short circuit or an open connection for the second frequency, the communications system being selected from a group of communications systems comprising a GSM communications system, a DECT communications system and a Bluetooth® communications system.

15. The transmitter of claim 11, wherein the resonator comprises a series connection of at least one capacitor and at least one inductor, said series connection being connected in parallel with an inductor.

16. The transmitter of claim 11, wherein the resonator comprises a parallel connection of at least one capacitor and at least one inductor, said parallel connection being connected in series with a capacitor.

17. The transmitter of claim 11, wherein the frequency multiplier is a frequency doubler.

18. The transmitter of claim 11, wherein the first frequency is adjustable with the aid of a voltage or current.

19. The transmitter of claim 12, wherein the resonator comprises a series connection of at least one capacitor and at least one inductor, said series connection being connected in parallel with an inductor.

20. The transmitter of claim 12, wherein the resonator comprises a parallel connection of at least one capacitor and at least one inductor, said parallel connection being connected in series with a capacitor.

21. The transmitter of claim 12, wherein the frequency divider is a frequency halver.

22. The transmitter of claim 12, wherein the first frequency is adjustable with the aid of a voltage or current.

23. Use of a transmitter provided with an oscillator according to claim 13, wherein the resonator comprises a series connection of at least one capacitor and at least one inductor, said series connection being connected in parallel with an inductor.

24. Use of a transmitter provided with an oscillator according to claim 13, wherein the resonator comprises a parallel connection of at least one capacitor and at least one inductor, said parallel connection being connected in series with a capacitor.

25. Use of a transmitter provided with an oscillator according to claim 13, wherein the frequency multiplier is a frequency doubler.

26. Use of a transmitter provided with an oscillator according to claim 13, wherein the first frequency is adjustable with the aid of a voltage or current.

27. Use of a transmitter provided with an oscillator according to claim 14, wherein the resonator comprises a series connection of at least one capacitor and at least one inductor, said series connection being connected in parallel with an inductor.

28. Use of a transmitter provided with an oscillator according to claim 14, wherein the resonator comprises a parallel connection of at least one capacitor and at least one inductor, said parallel connection being connected in series with a capacitor.

29. Use of a transmitter provided with an oscillator according to claim 14, wherein the frequency divider is a frequency halver.

30. Use of a transmitter provided with an oscillator according to claim 14, wherein the first frequency is adjustable with the aid of a voltage or current.

* * * * *